(12) United States Patent
Xu et al.

(10) Patent No.: US 9,583,425 B2
(45) Date of Patent: Feb. 28, 2017

(54) SOLDER FATIGUE ARREST FOR WAFER LEVEL PACKAGE

(71) Applicant: Maxim Integrated Products, Inc., San Jose, CA (US)

(72) Inventors: Yong Li Xu, Plano, TX (US); Tiao Zhou, Carrollton, TX (US); Xiansong Chen, Allen, TX (US); Kaysar M. Rahim, Irving, TX (US); Viren Khandekar, Flower Mound, TX (US); Yi-Sheng Anthony Sun, San Jose, CA (US); Arkadii V. Samoilov, Saratoga, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 106 days.

(21) Appl. No.: 13/929,978

(22) Filed: Jun. 28, 2013

(65) Prior Publication Data
US 2014/0131859 A1    May 15, 2014

Related U.S. Application Data

(63) Continuation-in-part of application No. 13/396,804, filed on Feb. 15, 2012, now Pat. No. 8,643,150.
(Continued)

(51) Int. Cl.
*H01L 23/498* (2006.01)
*H01L 23/00* (2006.01)
*H01L 21/768* (2006.01)

(52) U.S. Cl.
CPC .. *H01L 23/49811* (2013.01); *H01L 21/76885* (2013.01); *H01L 24/05* (2013.01);
(Continued)

(58) Field of Classification Search
CPC ............... H01L 23/4824; H01L 23/488; H01L 24/04–24/06; H01L 23/10–23/14;
(Continued)

(56) References Cited

U.S. PATENT DOCUMENTS

| 5,453,582 A | * 9/1995 | Amano | ................. B23K 35/34 174/260 |
|---|---|---|---|
| 6,028,357 A | 2/2000 | Moriyama | |

(Continued)

FOREIGN PATENT DOCUMENTS

GB         2150754 A  *  7/1985   ......... H01L 23/4824

*Primary Examiner* — David Zarneke
(74) *Attorney, Agent, or Firm* — Advent, LLP

(57) ABSTRACT

A wafer level package includes a wafer, a lead disposed of the wafer for connecting the wafer to an electrical circuit, and a core disposed of the lead. In some embodiments, the lead disposed of the wafer is a copper pillar, and the core is plated onto the copper pillar. In some embodiments, the core is polymer screen-plated onto the lead. In some embodiments, the core extends between at least approximately thirty-five micrometers (35 μm) and fifty micrometers (50 μm) from the lead. In some embodiments, the core covers between at least approximately one-third (⅓) and one-half (½) of the surface area of the lead. In some embodiments, the core comprises a stud-shape extending from the lead. In some embodiments, the core extends perpendicularly across the lead. In some embodiments, the core extends longitudinally along the lead. Further, a portion of the core can extend perpendicularly from a longitudinal core.

8 Claims, 10 Drawing Sheets

Related U.S. Application Data

(60) Provisional application No. 61/782,465, filed on Mar. 14, 2013.

(52) U.S. Cl.
CPC ............. *H01L 24/06* (2013.01); *H01L 24/14* (2013.01); *H01L 24/16* (2013.01); *H01L 24/32* (2013.01); *H01L 24/33* (2013.01); *H01L 24/81* (2013.01); *H01L 24/83* (2013.01); *H01L 24/13* (2013.01); *H01L 24/29* (2013.01); *H01L 2224/0219* (2013.01); *H01L 2224/02165* (2013.01); *H01L 2224/02185* (2013.01); *H01L 2224/0401* (2013.01); *H01L 2224/04026* (2013.01); *H01L 2224/0569* (2013.01); *H01L 2224/05541* (2013.01); *H01L 2224/05548* (2013.01); *H01L 2224/05552* (2013.01); *H01L 2224/05554* (2013.01); *H01L 2224/05555* (2013.01); *H01L 2224/05563* (2013.01); *H01L 2224/05569* (2013.01); *H01L 2224/05573* (2013.01); *H01L 2224/05578* (2013.01); *H01L 2224/05647* (2013.01); *H01L 2224/0603* (2013.01); *H01L 2224/06051* (2013.01); *H01L 2224/10125* (2013.01); *H01L 2224/131* (2013.01); *H01L 2224/13013* (2013.01); *H01L 2224/1403* (2013.01); *H01L 2224/1416* (2013.01); *H01L 2224/14051* (2013.01); *H01L 2224/16225* (2013.01); *H01L 2224/16227* (2013.01); *H01L 2224/26125* (2013.01); *H01L 2224/29013* (2013.01); *H01L 2224/32227* (2013.01); *H01L 2224/3303* (2013.01); *H01L 2224/3316* (2013.01); *H01L 2224/33051* (2013.01); *H01L 2224/81192* (2013.01); *H01L 2224/81365* (2013.01); *H01L 2224/81815* (2013.01); *H01L 2224/83192* (2013.01); *H01L 2224/83365* (2013.01); *H01L 2224/83815* (2013.01); *H01L 2924/351* (2013.01); *H01L 2924/3841* (2013.01)

(58) Field of Classification Search
CPC ....... H01L 23/48; H01L 23/34; H01L 23/367; H01L 23/3672; H01L 23/3677; H01L 24/02; H01L 24/28; H01L 23/49811; H01L 23/49816; H01L 2224/02165; H01L 2224/06125; H01L 2224/0212–2224/0215; H01L 2224/0218; H01L 2224/02185; H01L 2224/05552–2224/05554; H01L 2224/05557; H01L 2224/10125; H01L 2224/1401; H01L 2224/14517; H01L 2224/14519; H01L 2224/17517; H01L 2224/17519; H01L 2224/26125; H01L 2224/33517; H01L 2224/33519; H01L 2224/0601; H01L 2224/06517; H01L 2224/06519
USPC ..................... 257/779, 780, 781, 773, 786
See application file for complete search history.

(56) References Cited

U.S. PATENT DOCUMENTS

| | | | |
|---|---|---|---|
| 6,281,107 B1 * | 8/2001 | Moriyama .................. 438/613 |
| 6,429,046 B1 | 8/2002 | Marlin | |
| 6,806,562 B2 | 10/2004 | Barchmann | |
| 6,853,092 B2 * | 2/2005 | Ashida .................. H05K 1/111 | |
| | | | 257/737 |
| 6,927,471 B2 | 8/2005 | Salmon | |
| 7,057,292 B1 * | 6/2006 | Elenius ............... H01L 21/4853 |
| | | | 257/690 |
| 7,741,716 B1 * | 6/2010 | Venkitachalam ....... H01L 24/05 |
| | | | 257/758 |
| 7,750,466 B2 | 7/2010 | Rothman | |
| 8,409,979 B2 * | 4/2013 | Choi ................. H01L 23/49811 |
| | | | 257/738 |
| 8,599,611 B2 * | 12/2013 | Shalvi .................... G11C 16/26 |
| | | | 365/185.02 |
| 8,643,150 B1 * | 2/2014 | Xu et al. ....................... 257/632 |
| 8,684,116 B2 * | 4/2014 | Nakashima ............ B60K 11/08 |
| | | | 180/68.1 |
| 8,802,554 B2 * | 8/2014 | Sutardja .................. H01L 24/05 |
| | | | 438/612 |
| 8,853,853 B2 * | 10/2014 | Chang .................... H01L 24/13 |
| | | | 257/737 |
| 2006/0055032 A1 | 3/2006 | Chang | |
| 2006/0131758 A1 * | 6/2006 | Dao .................. H01L 23/49816 |
| | | | 257/779 |
| 2006/0292711 A1 * | 12/2006 | Su et al. .......................... 438/14 |
| 2010/0102444 A1 * | 4/2010 | Khor et al. ................... 257/737 |
| 2012/0043655 A1 | 2/2012 | Khor | |
| 2012/0205812 A1 * | 8/2012 | Sutardja ....................... 257/773 |
| 2012/0306104 A1 * | 12/2012 | Choi et al. ................... 257/782 |
| 2012/0329263 A1 * | 12/2012 | Chou et al. ................... 438/612 |
| 2013/0001777 A1 * | 1/2013 | Veychard et al. ........... 257/738 |
| 2013/0026619 A1 * | 1/2013 | Chang ..................... H01L 24/13 |
| | | | 257/737 |
| 2013/0147031 A1 * | 6/2013 | Chen et al. ................... 257/737 |
| 2013/0187277 A1 * | 7/2013 | Chen et al. ................... 257/762 |
| 2013/0228897 A1 * | 9/2013 | Chen et al. ................... 257/621 |
| 2013/0234327 A1 * | 9/2013 | Kasai et al. .................. 257/738 |
| 2013/0256881 A1 * | 10/2013 | Morifuji et al. ............. 257/737 |
| 2014/0015124 A1 * | 1/2014 | Fay et al. ...................... 257/737 |
| 2014/0246763 A1 * | 9/2014 | Bunyk .......................... 257/663 |
| 2014/0367077 A1 * | 12/2014 | Wu ........................... H01L 23/36 |
| | | | 165/185 |

* cited by examiner

SOLDER FATIGUE ARREST FOR WAFER LEVEL PACKAGE

CROSS-REFERENCE TO RELATED APPLICATIONS

The present application claims the benefit under 35 U.S.C. §119(e) of U.S. Provisional Application Ser. No. 61/782,465, filed Mar. 14, 2013, and titled "SOLDER FATIGUE ARREST FOR WAFER LEVEL PACKAGE." The present application is also a continuation-in-part under 35 U.S.C. §120 of U.S. patent application Ser. No. 13/396,804, filed Feb. 15, 2012, and titled "WAFER-LEVEL PACKAGE DEVICE HAVING SOLDER BUMP ASSEMBLIES THAT INCLUDE AN INNER PILLAR STRUCTURE." U.S. Provisional Application Ser. No. 61/782,465 and U.S. patent application Ser. No. 13/396,804 are herein incorporated by reference in their entireties.

BACKGROUND

An ever present objective of semiconductor assembly is to provide packages for enclosing/encasing semiconductor components that are smaller, thinner, cooler, and less expensive to manufacture at a high rate of production. One type of semiconductor package is the Plastic Dual In-line Package (PDIP). Another type of semiconductor package is the gull-wing Small Outline (SO) package. These semiconductor packages generally include leads (connectors) extending from the sides of the package. Other types of semiconductor packages are flat lead-less packages, such as Dual Flat No-leads (DFN) and Quad Flat No-leads (QFN) packages. A DFN package has lead lands on only two sides of the perimeter of the package bottom, while a QFN package has lead lands on four sides of the package bottom.

Some DFN and QFN package sizes can range from one millimeter (1 mm) by two millimeter (2 mm) packages having three (3) lead lands, to ten millimeter (10 mm) by ten millimeter (10 mm) packages having sixty-eight (68) lead lands. Because the lead-frame is on the bottom of the package, flat no-lead packages can provide superior thermal performance when compared to leaded packages having similar body size and lead counts. Further, in a flat no-leads configuration, the die-attach-pad can be exposed on the bottom exterior of the package, allowing it to be soldered directly to a printed circuit board, and providing a direct route for heat to dissipate away from the package. The exposed die-attach-pad, often referred to as an exposed thermal pad, may greatly improve heat transfer out of the integrated circuit package and into the printed circuit board.

SUMMARY

A wafer level package includes a wafer, a lead disposed of the wafer for connecting the wafer to an electrical circuit, and a core disposed of the lead. In some embodiments, the lead disposed of the wafer is a copper pillar, and the core is plated onto the copper pillar. In some embodiments, the core is polymer screen-plated onto the lead. In some embodiments, the core extends between at least approximately thirty-five micrometers (35 µm) and fifty micrometers (50 µm) from the lead. In some embodiments, the core covers between at least approximately one-third (⅓) and one-half (½) of the surface area of the lead. In some embodiments, the core comprises a stud-shape extending from the lead. In some embodiments, the core extends perpendicularly across the lead. In some embodiments, the core extends longitudinally along the lead. Further, a portion of the core can extend perpendicularly from a longitudinal core.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

Figure 6:
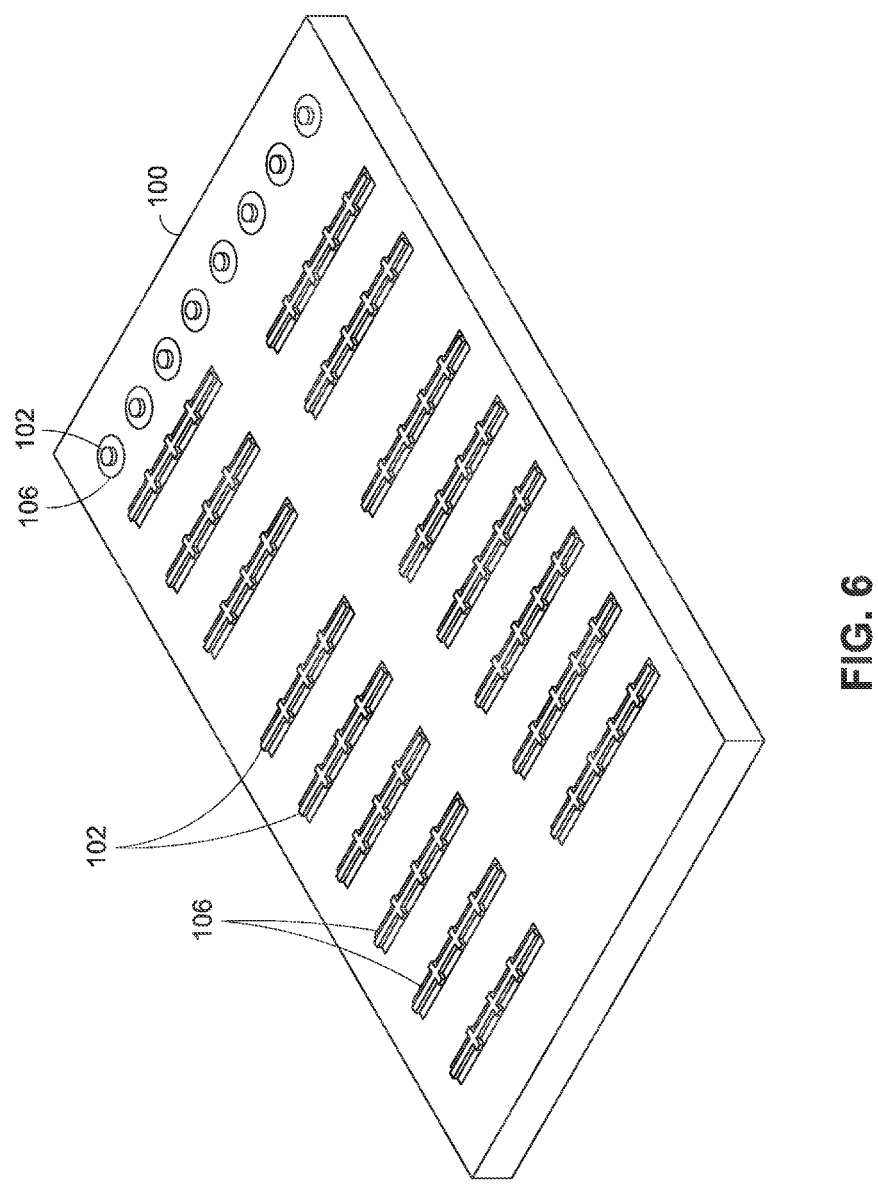

FIG. 6 is an isometric view illustrating a further wafer level package, where connections disposed on the wafer level package include multiple stud-shaped non-fatigue cores and multiple non-fatigue cores that extend longitudinally along leads of the wafer level package, with portions of the non-fatigue cores extending perpendicularly from the longitudinal portions of the non-fatigue cores in accordance with example embodiments of the present disclosure.

Figure 7:
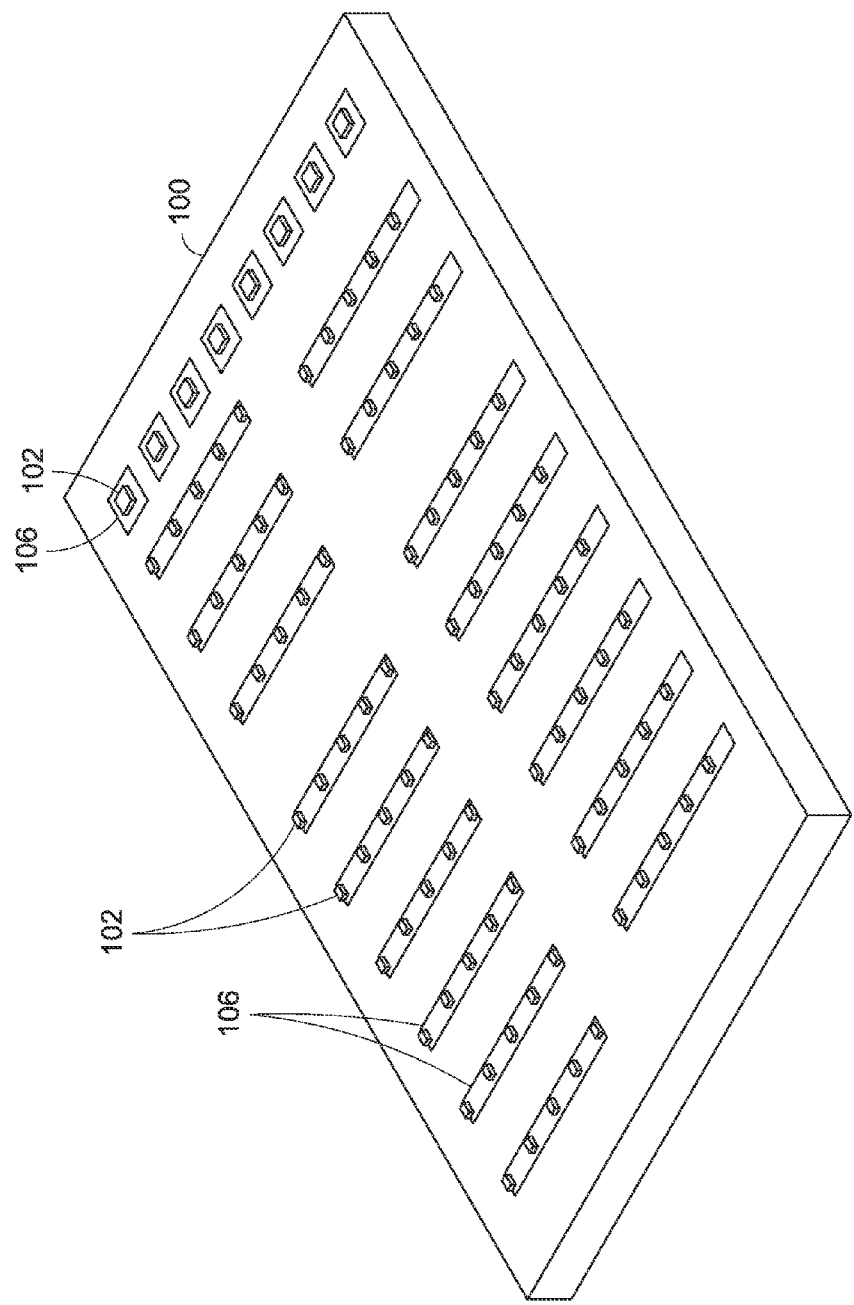

FIG. 7 is an isometric view illustrating another wafer level package, where connections disposed on the wafer level package include multiple stud-shaped non-fatigue cores in accordance with example embodiments of the present disclosure.

Figure 8:
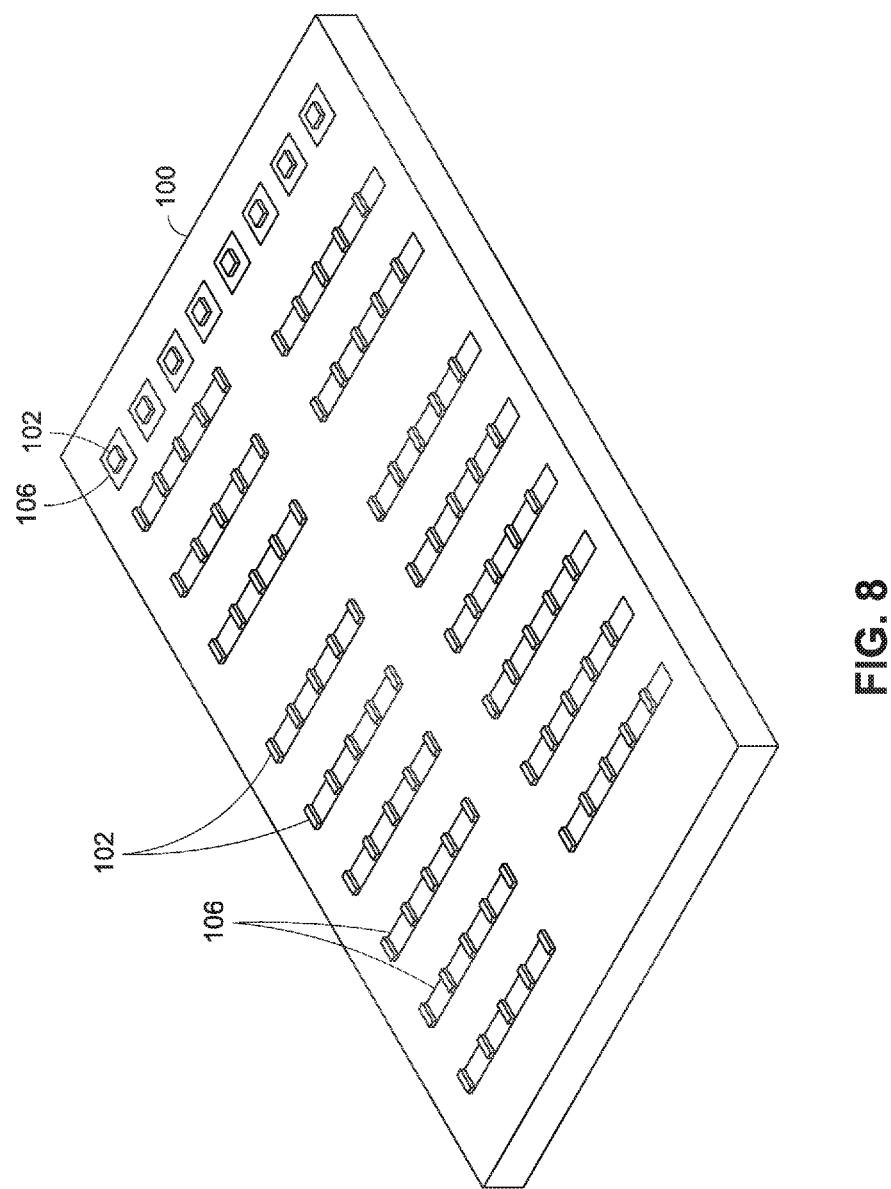

FIG. 8 is an isometric view illustrating a still further wafer level package, where connections disposed on the wafer level package include multiple stud-shaped non-fatigue cores and multiple non-fatigue cores that extend perpendicularly across leads of the wafer level package in accordance with example embodiments of the present disclosure.

Figure 9:
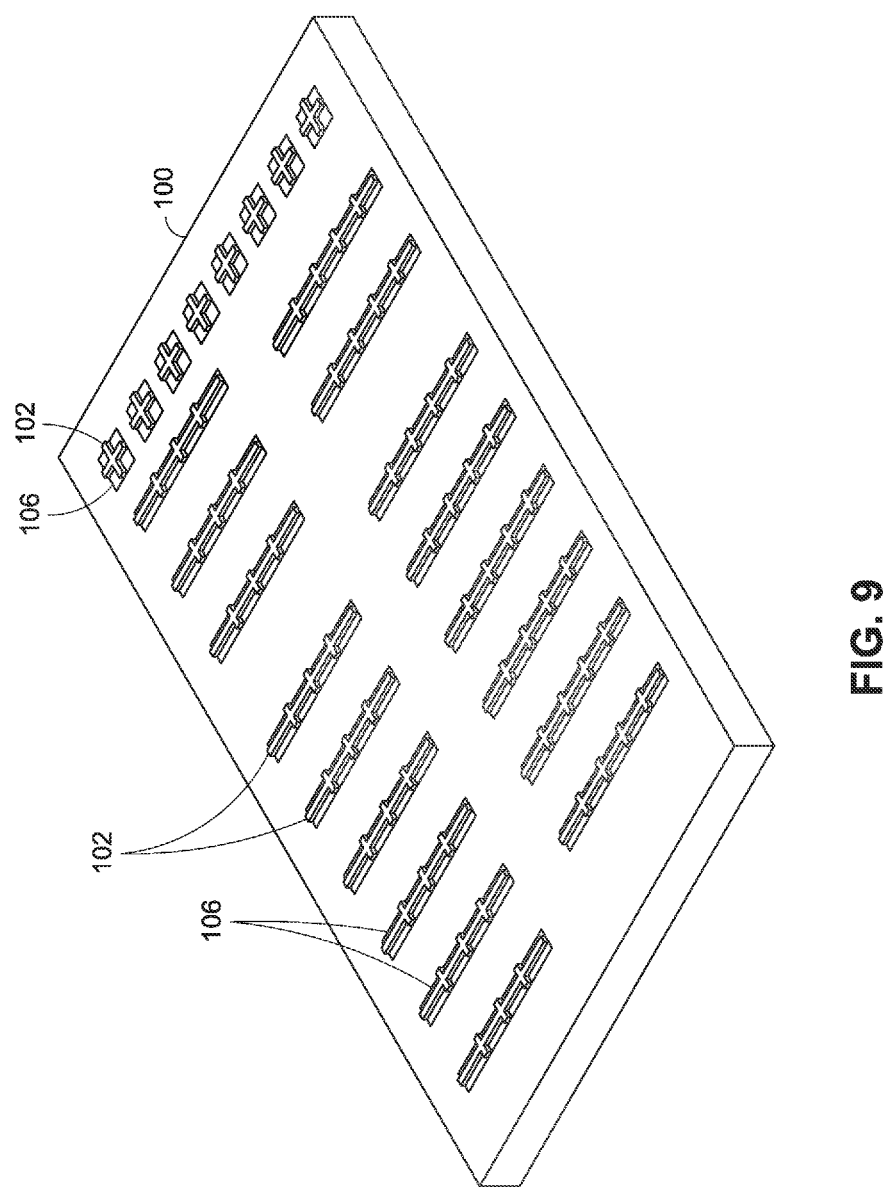

FIG. 9 is an isometric view illustrating another wafer level package, where connections disposed on the wafer level package include multiple non-fatigue cores that extend longitudinally along leads of the wafer level package, with portions of the non-fatigue cores extending perpendicularly from the longitudinal portions of the non-fatigue cores in accordance with example embodiments of the present disclosure.

Figure 10:
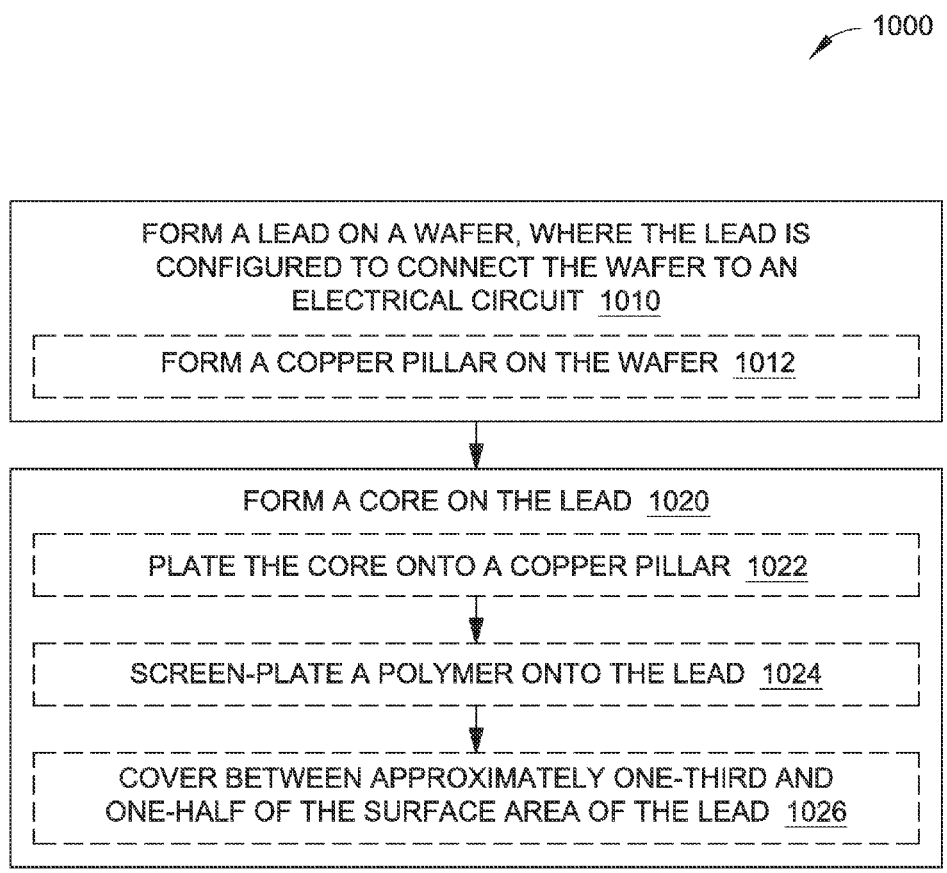

FIG. 10 is a flow diagram illustrating a method of forming a wafer level package, where the wafer level package includes a connection with a non-fatigue core in accordance with example embodiments of the present disclosure.

DETAILED DESCRIPTION

Overview

Flat no-leads Integrated Circuit (IC) packages, such as DFN (Dual Flat No-leads) packages and QFN (Quad Flat No-leads) packages, are used to physically and electrically connect ICs to printed circuit boards. The term "flat no-leads" is used to describe surface-mount technology allowing an IC to be connected to the surface of a Printed Circuit Board (PCB) without through-holes, and so on. Leadless connections/terminals (lead lands) and an exposed thermal pad are typically provided on the bottom of a flat no-leads IC package for connecting the package to a PCB. The lead lands are generally positioned at the perimeter of the package bottom, while the exposed thermal pad is located in the center of the package bottom, between the lead lands. Individual flat no-leads packages may be formed together, molded, and plated in a block format on a panel, and then singulated into separate devices after fabrication (e.g., by sawing or punching the packages out of the panel).

Figure 1A:
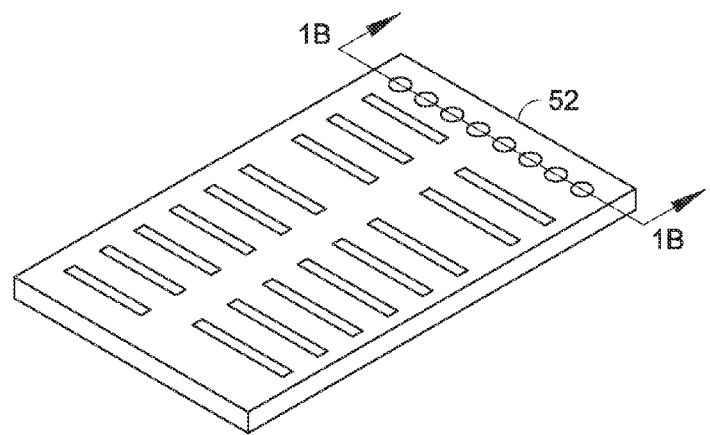
FIG. 1A is a plan view illustrating a wafer level package configured to be connected to a printed circuit board for a temperature cycling test.
Figure 1B:
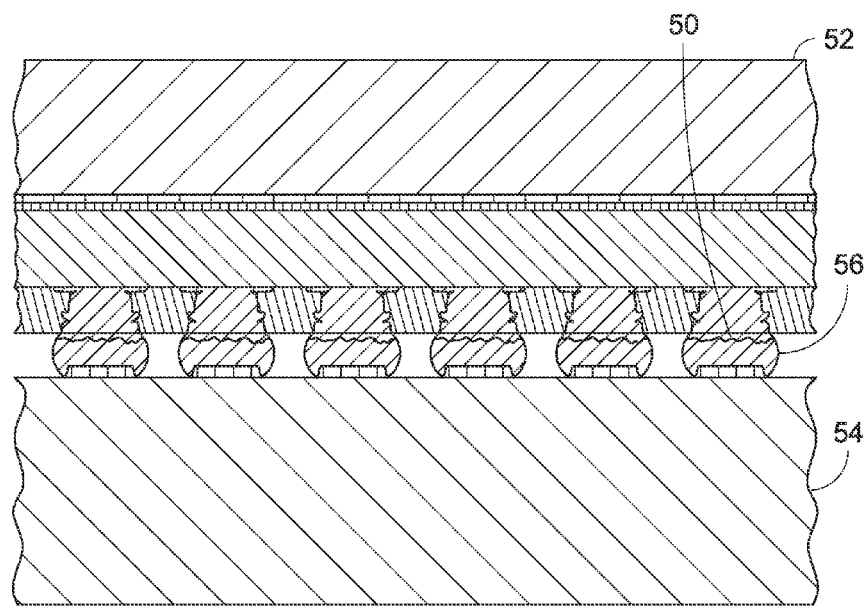
FIG. 1B is a cross-sectional side elevation view of solder cracks occurring on the package side of the connection between the wafer level package and the printed circuit board during the temperature cycling test.
Figure 2:
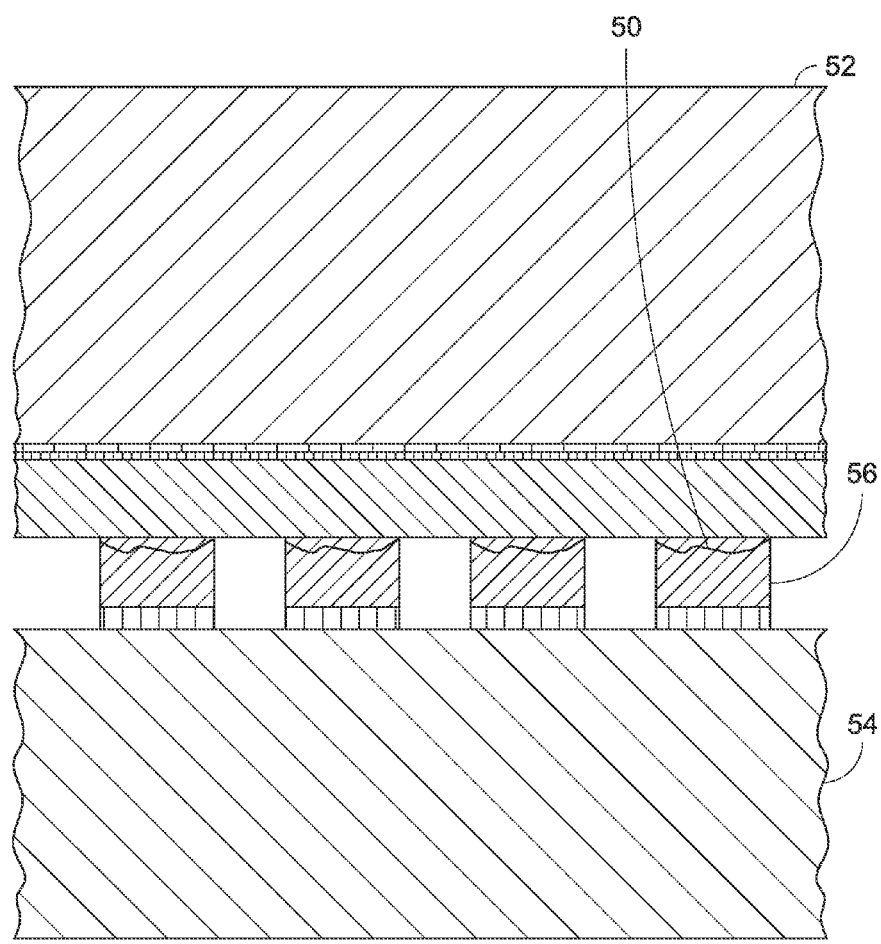
FIG. 2 is a partial cross-sectional side elevation view illustrating solder cracks occurring on the package side of the connection between a wafer level package and a printed circuit board during a temperature cycling test.
Figure 3:
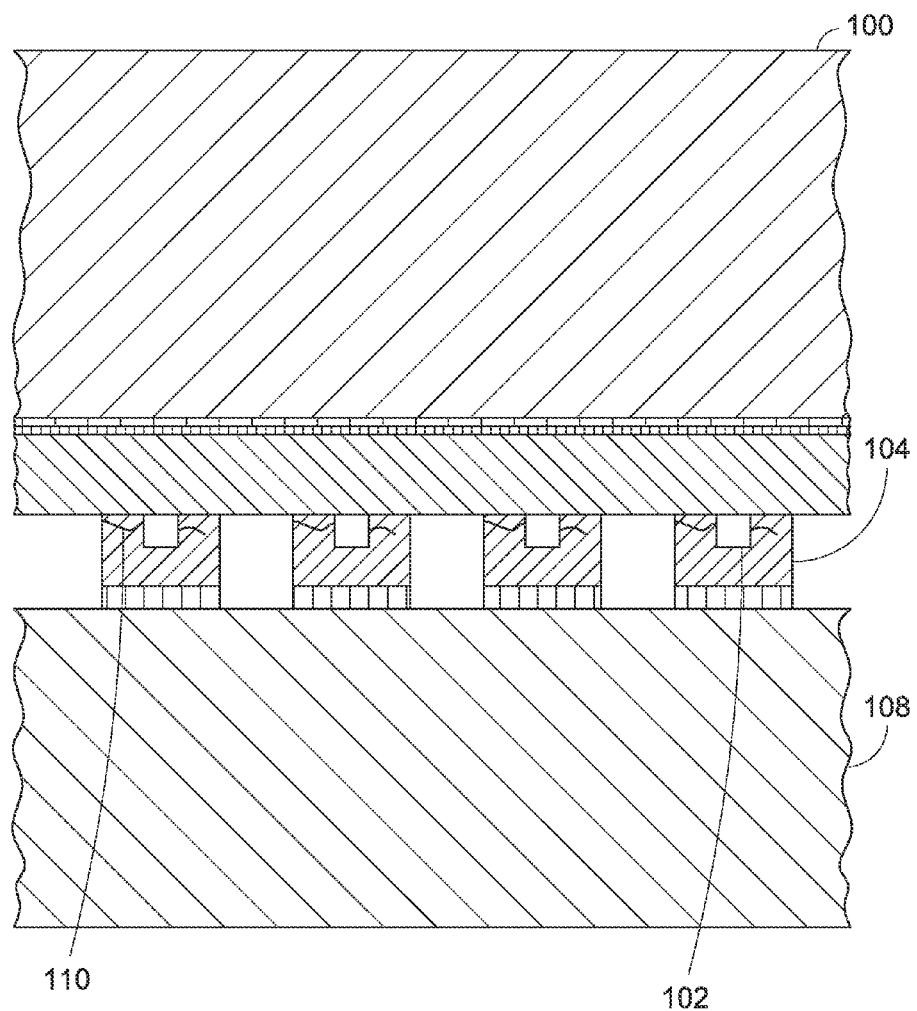
FIG. 3 is a partial cross-sectional side elevation view illustrating a wafer level package connected to a printed circuit board, where a connection between the wafer level package and the printed circuit board includes a non-fatigue core in accordance with example embodiments of the present disclosure.

Oftentimes, wafer level packages fail board-level reliability testing as a result of solder fatigue. For example, during temperature cycling tests (TCT), components may become open at less than five hundred (500) cycles when solder joints completely crack. A temperature cycle test can be performed by cycling the temperature of the wafer level package between approximately minus forty degrees Celsius (−40° C.) and one hundred and twenty five degrees Celsius (125° C.). A cause of solder fatigue is thermal stress resulting from differences in the coefficients of thermal expansion (CTE) between a wafer level package and a printed circuit board (PCB). As shown in FIGS. 1A through 2, solder cracks 50 can occur on the package side of the connection between a wafer level package 52 and a PCB 54 during a temperature cycling test. As a result, a solder joint 56 is fractured near the package side, the crack 50 grows with progression of the TCT, and eventually the solder joint 50 is completely broken.

The present disclosure is directed to techniques and systems for reducing or preventing solder fatigue failure for flat lead-less wafer level packages (e.g., Dual Flat No-leads (DFN) packages, Quad Flat No-leads (QFN) packages, and so forth). For example, solder joint cracks are reduced or prevented for wafer level QFN (WL-QFN) packages during temperature cycle testing. These techniques can be used to increase the reliability and robustness of, for instance, chip scale packages (CSP) for power products. As described, a non-fatigue core (e.g., formed of copper and/or one or more other metals) is introduced proximate to a solder joint (e.g., inside a solder joint) and acts as a crack arrest to reduce or prevent crack propagation through the solder joint. In embodiments of the disclosure, when a solder crack propagates to the wall of a non-fatigue core, the crack is arrested there. In this manner, solder fatigue is prevented from opening the connection.

Example Implementations

Figure 4:
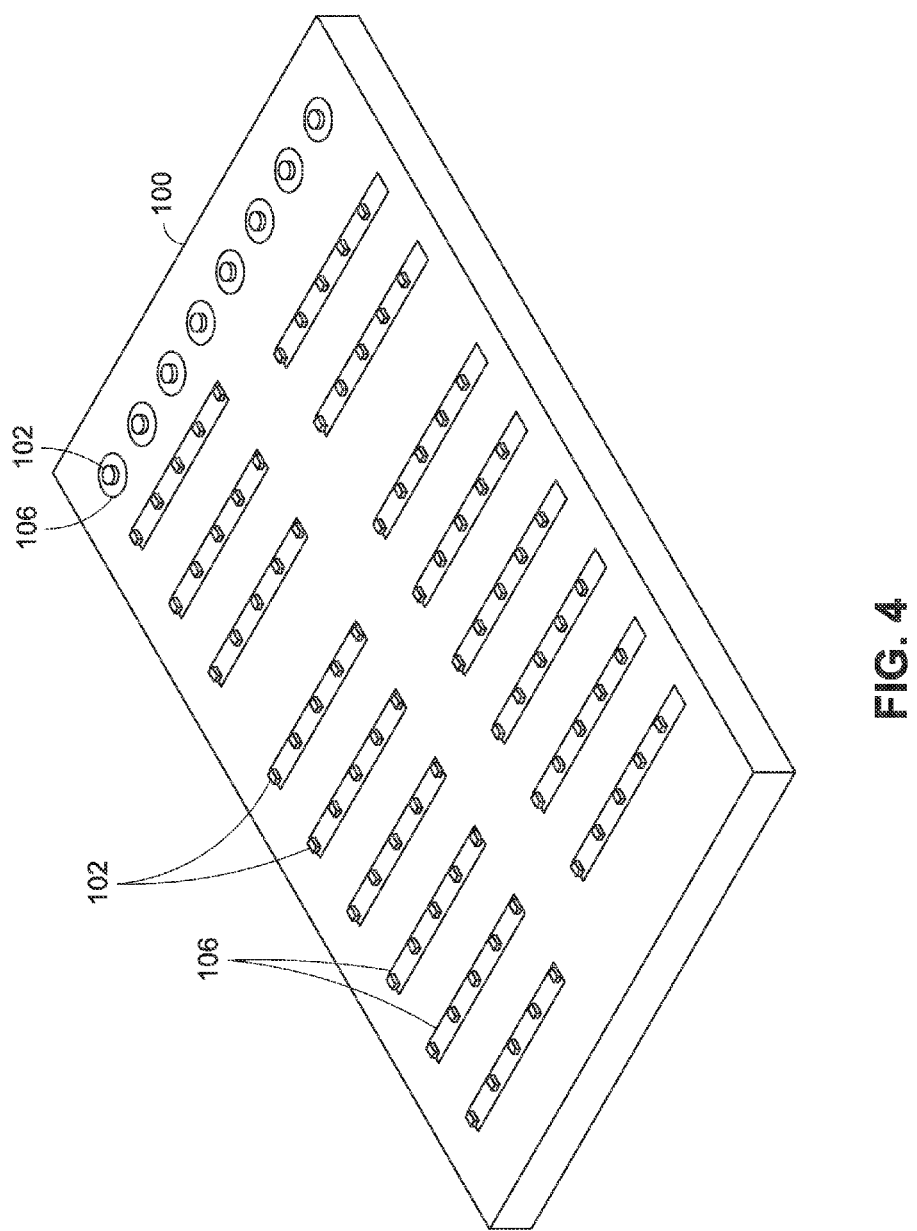
FIG. 4 is an isometric view illustrating a wafer level package, where connections disposed on the wafer level package include multiple stud-shaped non-fatigue cores in accordance with example embodiments of the present disclosure.
Figure 5:
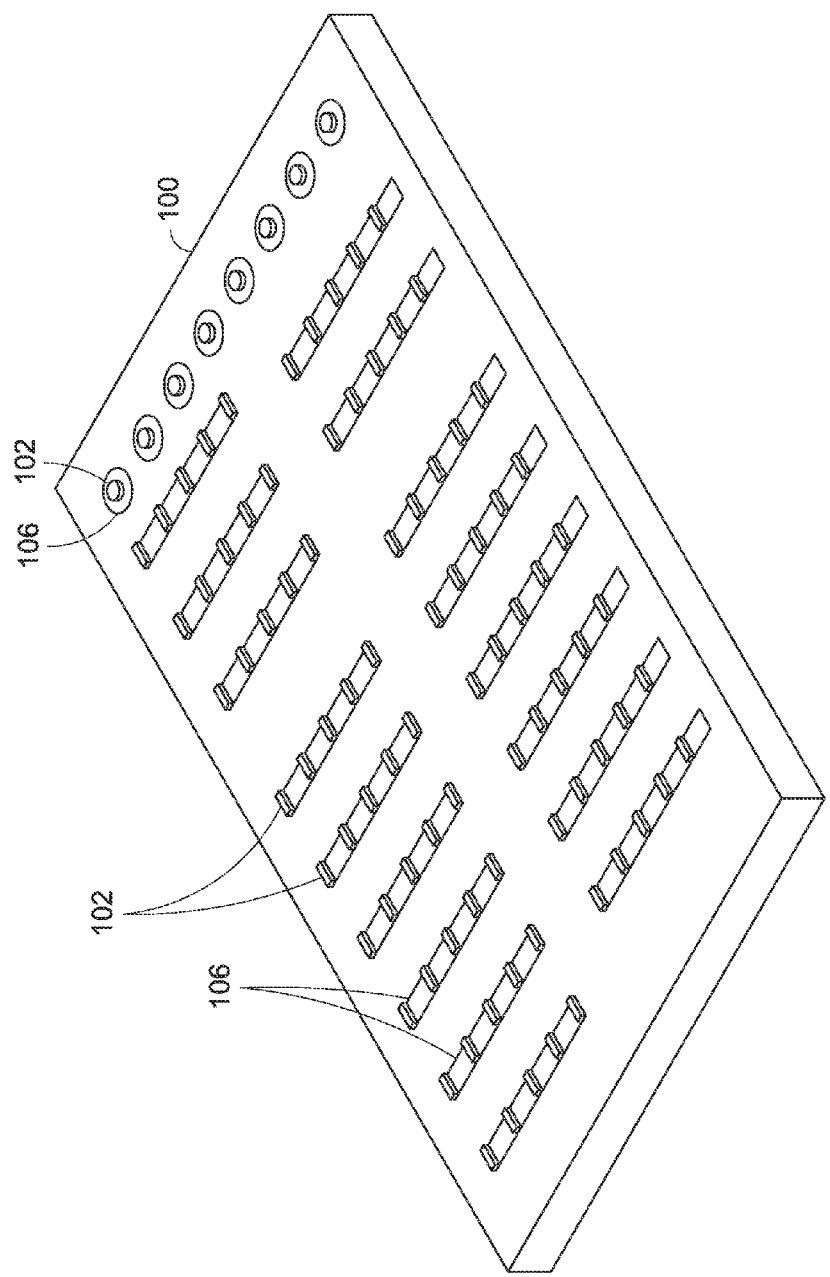
FIG. 5 is an isometric view illustrating another wafer level package, where connections disposed on the wafer level package include multiple stud-shaped non-fatigue cores and multiple non-fatigue cores that extend perpendicularly across leads of the wafer level package in accordance with example embodiments of the present disclosure.

Referring now to FIGS. 3 through 9, wafer level packages 100 including one or more cores (e.g., non-fatigue cores 102) are described. The wafer level packages 100 can be implemented as WL-QFNs, QFNs, DFNs, and so forth. For example, in some embodiments, a wafer level package 100 is implemented as a power product CSP having one or more leads 106 configured to carry current and/or heat. In some embodiments, a wafer level package 100 is formed using a molding process, and the leads 106 comprise thick copper pillar bars. As shown, the non-fatigue cores 102 can be positioned proximate to a solder joint 104 (e.g., inside a solder joint). In some embodiments, a copper non-fatigue core 102 is plated onto a lead 106 of a wafer level package 100. For example, a copper non-fatigue core 102 is plated onto a copper pillar lead 106 on a WL-QFN. In other embodiments, a polymer non-fatigue core 102 can be screen-plated onto a lead 106, cured on a lead 106, and so forth. As shown in FIGS. 4 and 7, metal (e.g., copper) studs 102 are plated onto the leads 106 of a WL-QFN. However, this configuration is provided by way of example only and is not meant to limit the present disclosure. In other embodiments, the non-fatigue cores 102 can have other shapes. For instance, in FIGS. 5 and 8, non-fatigue cores 102 are plated perpendicularly across the leads 106 of a WL-QFN 100, and in FIGS. 6 and 9, non-fatigue cores 102 are plated longitudinally along the leads 106 of a WL-QFN 100 with non-fatigue cores 102 periodically extending perpendicularly from the longitudinal non-fatigue cores 102 along the length of the leads 106. Further, other variously shaped non-fatigue cores 102 can be used in addition to those illustrated in FIGS. 3 through 9, including, but not necessarily limited to: serpentine-shaped non-fatigue cores, zigzag-shaped non-fatigue cores, arc-shaped non-fatigue cores, grid-shaped non-fatigue cores, and so forth.

In embodiments of the disclosure, after a wafer level package 100 is connected to a printed circuit board 108, solder 104 is reflowed onto the leads 106 and surrounds the walls of the non-fatigue cores 102. In this manner, a non-fatigue core 102 becomes the core of a solder joint 104 after board mounting. A non-fatigue core 102 acts as a crack arrest to reduce or prevent crack propagation 110 through the solder joint 104. In some embodiments, the height of a non-fatigue core 102 with respect to a lead 106 of a wafer level package 100 ranges from between approximately thirty-five micrometers (35 µm) to approximately fifty micrometers (50 µm). However, this range is provided by way of example only and is not meant to limit the present disclosure. In other embodiments, a non-fatigue core 102 can be less than approximately thirty-five micrometers (35 µm) in height with respect to a lead 106 or greater than approximately fifty micrometers (50 µm) in height with respect to a lead 106. Further, in some embodiments, the area of a lead 106 covered by non-fatigue core 102 ranges from between approximately one-third (⅓) to one-half (½) of the exposed surface area of the lead 106. However, this range is provided by way of example only and is not meant to limit the present disclosure. In other embodiments, a non-fatigue core 102 can cover less than approximately one-third (⅓) of the exposed surface area of a lead 106 or greater than approximately one-half (½) of the exposed surface area of the lead 106.

Example Process

Referring now to FIG. 10, example techniques are described for fabricating a wafer level package, where the wafer level package includes a connection with a non-fatigue core in accordance with example embodiments of the present disclosure. FIG. 10 depicts a process 1000, in example implementations, for fabricating a wafer level package, such as the wafer level packages 100 illustrated in FIGS. 3 through 9 and described above.

In the process 1000 illustrated, a lead is formed on a wafer. The lead is configured to connect the wafer to an electrical circuit (Block 1010). For example, with reference to FIGS. 3 through 9, wafer level packages 100 are configured as flat no-leads packages, with one or more leads 106 (e.g., die-attach-pads) exposed on the bottom exterior of the packages 100. The leads 106 allow packages 100 to be soldered directly to printed circuit board 108, providing a direct route for heat transfer between the packages 100 and the PCB 108. In some embodiments, a lead is formed on a wafer by forming a copper pillar on the wafer (Block 1012). For instance, with continuing reference to FIGS. 3 through 9, a copper pillar lead 106 is formed on a wafer of wafer level package 100.

Then, a core is formed on the lead (Block 1020). For example, with continuing reference to FIGS. 3 through 9, one or more non-fatigue cores 102 are formed on leads 106. In some embodiments, the core is plated onto a copper pillar (Block 1022). For instance, with continuing reference to FIGS. 3 through 9, one or more non-fatigue cores 102 are plated onto a lead 106 comprising a copper pillar. In some embodiments, the core comprises a polymer screen-plated onto the lead (Block 1024). For example, with continuing reference to FIGS. 3 through 9, one or more non-fatigue cores 102 comprise a polymer material screen-plated onto one or more leads 106. In some embodiments, the core covers between approximately one-third (⅓) and one-half (½) of the surface area of the lead (Block 1026). For instance, with continuing reference to FIGS. 3 through 9, non-fatigue cores 102 cover between approximately one-third (⅓) and one-half (½) of the surface area of leads 106.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A wafer level package comprising:
   a wafer;
   a longitudinal lead disposed on the wafer for connecting the wafer to an electrical circuit, the lead configured to transmit heat between the wafer level package and the electrical circuit;
   a longitudinal non-fatigue polymer core extending along a length of the lead;
   a plurality of polymer cores periodically extending perpendicularly from the longitudinal non-fatigue polymer core along the length of the lead, at least one of the plurality of polymer cores extending from the longitudinal non-fatigue polymer core at an intermediate location along the length of the longitudinal non-fatigue polymer core; and
   solder deposited on the longitudinal non-fatigue polymer core and the plurality of polymer cores.

2. The wafer level package as recited in claim 1, wherein the lead disposed on the wafer comprises a copper pillar bar, and the core is plated onto the copper pillar bar.

3. The wafer level package as recited in claim 1, wherein the longitudinal non-fatigue polymer core and the plurality of polymer cores extend between at least approximately thirty-five micrometers (35 μm) and fifty micrometers (50 μm) from the lead.

4. The wafer level package as recited in claim 1, wherein the longitudinal non-fatigue polymer core and the plurality of polymer cores cover between at least approximately one-third (⅓) and one-half (½) of the surface area of the lead.

5. The wafer level package as recited in claim 1, wherein the core comprises a stud-shape extending from the lead.

6. The wafer level package as recited in claim 1, wherein the core extends perpendicularly across the lead.

7. A wafer level package comprising:
   a wafer;
   a longitudinal lead disposed of the wafer for connecting the wafer to an electrical circuit;
   a longitudinal non-fatigue polymer core extending along a length of the lead;
   a plurality of polymer cores periodically extending from the longitudinal non-fatigue polymer core along the length of the lead, at least one of the plurality of polymer cores extending from the longitudinal non-fatigue polymer core at an intermediate location along the length of the longitudinal non-fatigue polymer core, wherein the longitudinal non-fatigue polymer core and the plurality of polymer cores cover between at least approximately one-third (⅓) and one-half (½) of the surface area of the lead, and extend between at least approximately thirty-five micrometers (35 μm) and fifty micrometers (50 μm) from the lead; and
   solder deposited on the longitudinal non-fatigue polymer core and the plurality of polymer cores.

8. The wafer level package as recited in claim 1, wherein each one of the plurality of polymer cores periodically extending perpendicularly from the longitudinal non-fatigue polymer core along the length of the lead comprises a generally rectangular screen-plated core formed on the lead.

* * * * *